United States Patent
Jang

(10) Patent No.: US 7,859,347 B2
(45) Date of Patent: Dec. 28, 2010

(54) SELF REFRESH OSCILLATOR AND OSCILLATION SIGNAL GENERATION METHOD OF THE SAME

(75) Inventor: Ji-Eun Jang, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 104 days.

(21) Appl. No.: 12/255,074

(22) Filed: Oct. 21, 2008

(65) Prior Publication Data

US 2009/0045883 A1 Feb. 19, 2009

Related U.S. Application Data

(63) Continuation of application No. 11/319,718, filed on Dec. 29, 2005, now Pat. No. 7,449,965.

(30) Foreign Application Priority Data

Dec. 30, 2004 (KR) ............................ 2004-0116671

(51) Int. Cl.
*H03L 1/00* (2006.01)
*G11C 5/00* (2006.01)
(52) U.S. Cl. .......................... 331/57; 331/186; 365/222
(58) Field of Classification Search .................. 331/57, 331/186; 365/222
See application file for complete search history.

(56) References Cited

U.S. PATENT DOCUMENTS

| 5,453,959 | A | 9/1995 | Sakuta et al. |
|---|---|---|---|
| 5,566,117 | A | 10/1996 | Okamura et al. |
| 5,680,359 | A | 10/1997 | Jeong |
| 6,100,768 | A * | 8/2000 | Hirayama .................... 331/57 |
| 6,154,408 | A | 11/2000 | Yuh |
| 6,281,760 | B1 | 8/2001 | Koelling et al. |
| 6,711,093 | B1 * | 3/2004 | Shore et al. .................. 365/236 |
| 6,868,026 | B2 | 3/2005 | Fujioka |
| 2005/0110592 | A1 | 5/2005 | Lee |

FOREIGN PATENT DOCUMENTS

| JP | 04-195890 | 7/1992 |
|---|---|---|
| JP | 06-215561 | 8/1994 |
| KR | 1994-0016235 | 7/1994 |
| KR | 1995-0004275 | 2/1995 |
| KR | 0131176 | 11/1997 |
| KR | 10-2004-0046660 | 6/2004 |

* cited by examiner

*Primary Examiner*—Robert Pascal
*Assistant Examiner*—James E Goodley
(74) *Attorney, Agent, or Firm*—IP & T Group LLP

(57) ABSTRACT

A self refresh period signal generator includes: a voltage detection unit for detecting a voltage level of a power supply voltage in order to generate a plurality of period control signals according to the detected voltage level; and an oscillation unit for generating a ring oscillation signal having a constant period determined by a resistance of a period control resistor when a self refresh signal is activated, wherein the resistance of the period control resistor is controlled according to logic levels of the plurality of period control signals.

9 Claims, 5 Drawing Sheets

SELF REFRESH OSCILLATOR AND OSCILLATION SIGNAL GENERATION METHOD OF THE SAME

RELATED APPLICATIONS

This application is a Continuation of U.S. application Ser. No. 11/319,718, filed Dec. 29, 2005, now U.S. Pat. No. 7,449,965 claiming priority of Korean Application No. 2004-0116671, filed Dec. 30, 2004, the entire contents of each of which are hereby incorporated by reference.

FIELD OF INVENTION

The present invention relates to a self refresh control device for use in a semiconductor memory device; and, more particularly, to a self refresh period signal generator and a method for stably maintaining a self refresh period in spite of a power supply voltage variation.

DESCRIPTION OF PRIOR ART

FIG. 1 is a block diagram showing a conventional self refresh period signal generator included in a double date rate synchronous dynamic random access memory (DDR SDRAM) device.

As shown, the conventional self refresh period signal generator includes a self refresh oscillator 10 for generating a periodic signal having a predetermined constant period when a self refresh signal sref is activated; and a self refresh divider 20 for dividing the periodic signal by a multiple of a predetermined number.

The self refresh oscillator 10 generates the periodic signal having a period of 1 μs when the self refresh signal sref is activated. Then, the self refresh divider 20 divides the periodic signal in order to generate a divided periodic signal having a period of 8 μs. Accordingly, a self refresh operation can be performed having a period of 8 μs.

Meanwhile, the period of the periodic signal generated by the self refresh oscillator 10 is changed when a voltage level of a power supply voltage VDD is changed; however, a specification of a DRAM, i.e., VDD=2.5V±0.2V, should be satisfied. Herein, if a high power supply voltage is supplied for a fast operational speed, a current consumption of IDD6 is increased because a self refresh period becomes faster.

SUMMARY OF INVENTION

It is, therefore, an object of the present invention to provide a self refresh control device for constantly maintaining a self refresh period in spied of a power supply voltage variation by compensating the variation of the power supply voltage.

In accordance with an aspect of the present invention, there is provided a self refresh period signal generator including: a voltage detection unit for detecting a voltage level of a power supply voltage in order to generate a plurality of period control signals according to the detected voltage level; and an oscillation unit for generating a ring oscillation signal having a constant period determined by a resistance of a period control resistor when a self refresh signal is activated, wherein the resistance of the period control resistor is controlled according to logic levels of the plurality of period control signals.

In accordance with another aspect of the present invention, there is provided a method for generating an oscillation signal having a constant period determined by a period control resistance, including the steps of: a) generating a plurality of period control signals according to each result of comparing a power supply voltage with each of a plurality of reference voltages, wherein the reference voltages are different each other; and b) adjusting the period control resistance according to the plurality of period control signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a self refresh period signal generation device in accordance with the present invention will be described in detail referring to the accompanying drawings.

Figure 1:
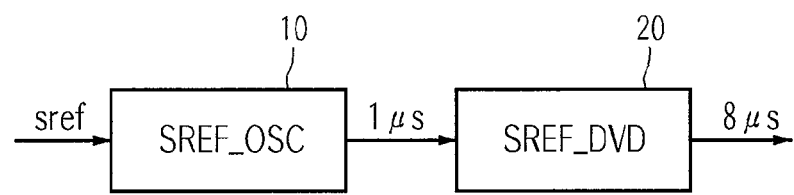
FIG. 1 is a block diagram showing a conventional self refresh period signal generator included in a double date rate synchronous dynamic random access memory (DDR SDRAM) device.
Figure 2:
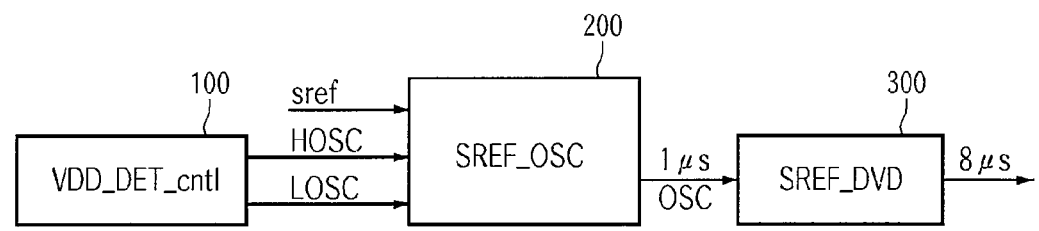
FIG. 2 is a block diagram showing a self refresh period signal generator in accordance with a preferred embodiment of the present invention.

FIG. 2 is a block diagram showing a self refresh period signal generator in accordance with a preferred embodiment of the present invention.

As shown, the self refresh period signal generator includes a voltage detection unit 100, an oscillator 200 and a divider 300.

The voltage detection unit 100 detects a voltage level of a power supply voltage VDD to thereby generate a first and a second period control signals HOSC and LOSC according to the detected voltage level of the power supply voltage VDD.

The oscillator 200 is enabled in response to a self refresh signal in order to generate an oscillation signal OSC having a predetermined period. The oscillator 200 controls the oscillation signal OSC so that the oscillation signal OSC have a constant period by adjusting a resistance which controls a period of the oscillation signal OSC according to logic levels of the first and the second period control signals HOSC and LOSC.

The divider 300 divides a period of the oscillation signal OSC by a multiple of a predetermined number. Herein, it is assumed that the oscillation signal OSC is divided by 8.

Figure 3:
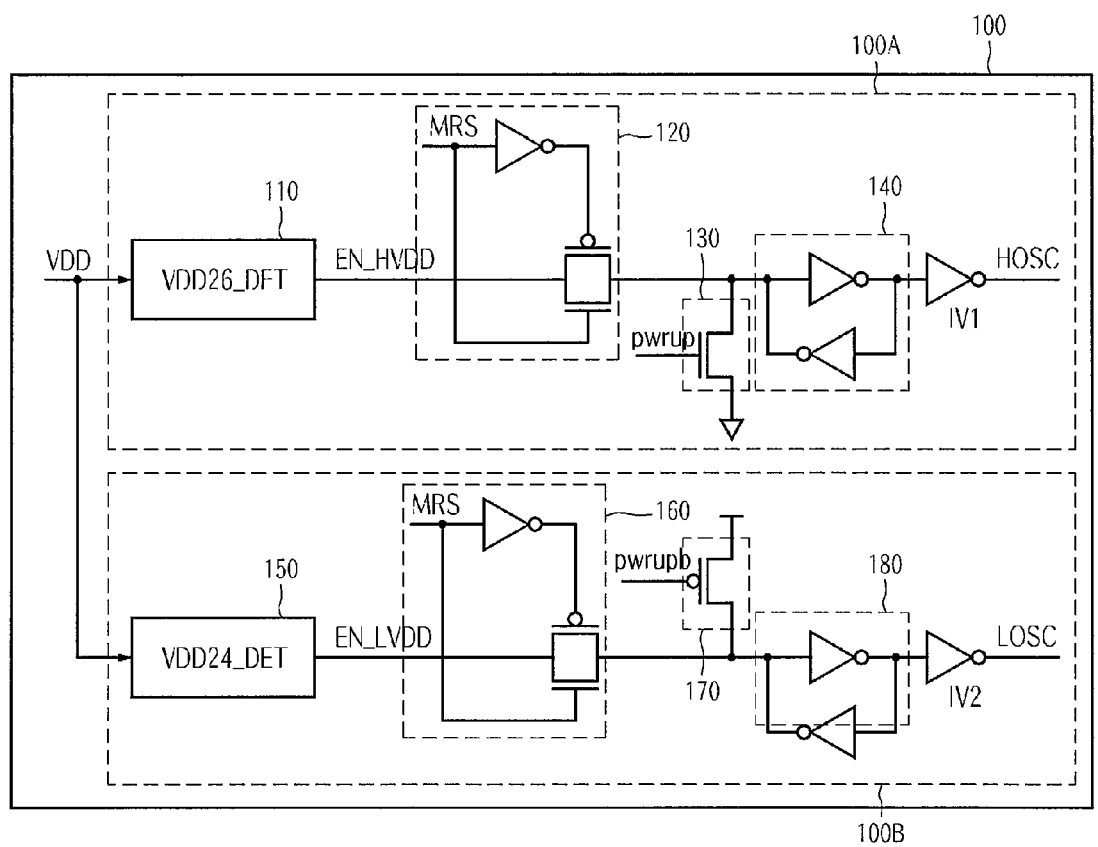
FIG. 3 is a schematic circuit diagram depicting the voltage detector shown in FIG. 2.

FIG. 3 is a schematic circuit diagram depicting the voltage detector 100 shown in FIG. 2.

As shown, the voltage detector 100 includes a first voltage comparing unit 100A and a second voltage comparing unit 100B.

The first voltage comparing unit 100A compares a voltage level of a power supply voltage VDD with that of a first reference voltage, e.g., 2.6V, in order to control a logic level of the first period control signal HOSC according to the comparison result. That is, the first voltage comparing unit 100A outputs the first period control signal HOSC as a logic high level when the power supply voltage VDD is higher than the first reference voltage. On the contrary, the first voltage comparing unit 100A outputs the first period control signal HOSC as a logic low level when the power supply voltage VDD is lower than the first reference voltage.

In detail, the first voltage comparing unit 100A includes a first power supply voltage detector 110, a first switching unit 120, a first initializing unit 130, a first latch unit 140 and a first inverter IV1.

The first power supply voltage detector 110 compares a voltage level of the power supply voltage VDD with that of the first reference voltage to thereby generate a first enable signal EN_HVDD according to the comparison result. The first switching unit 120 selectively transfers the first enable signal EN_HVDD according to a mode register set (MRS) signal.

The first initializing unit 140 initializes the first period control signal HOSC in response to a power up signal pwrup. The first latch unit 140 latches an output of the first switching unit 120 and the first inverter IV1 inverts an output of the first latch unit 140 to thereby generate the first period control signal HOSC.

Herein, the first initializing unit 130 initializes the first period control signal HOSC as a logic high level when the power up signal pwrup is activated. The on/off of the first switching unit 120 can be controlled by another mode control signal except for the MRS signal.

Meanwhile, the second voltage comparing unit 100B compares a voltage level of the power supply voltage VDD with that of a second reference voltage, e.g., 2.4V, in order to control a logic level of the second period control signal LOSC according to the comparison result. That is, the second voltage comparing unit 100B outputs the second period control signal LOSC as a logic high level when the power supply voltage VDD is higher than the second reference voltage. On the contrary, the second voltage comparing unit 100B outputs the second period control signal LOSC as a logic low level when the power supply voltage VDD is lower than the second reference voltage.

In detail, the second voltage comparing unit 100B includes a second power supply voltage detector 150, a second switching unit 160, a second initializing unit 170, a second latch unit 180 and a second inverter IV2.

The second power supply voltage detector 150 compares a voltage level of the power supply voltage VDD with that of the second reference voltage to thereby generate a second enable signal EN_LVDD according to the comparison result. The second switching unit 160 selectively transfers the second enable signal EN_LVDD according to the MRS signal.

The second initializing unit 170 initializes the second period control signal LOSC in response to a power up bar signal pwrupb. The second latch unit 180 latches an output of the second switching unit 160 and the second inverter IV2 inverts an output of the second latch unit 160 to thereby generate the second period control signal LOSC.

Herein, the second initializing unit 170 initializes the second period control signal LOSC as a logic high level when the power up bar signal pwrupb is activated.

A table shown in FIG. 3 illustrates the above-mentioned logic states of the first and the second period control signals HOSC and LOSC.

As shown, the first period control signal HOSC is in a logic low level when the power supply voltage VDD is lower than 2.4V or when the power supply voltage VDD ranges between 2.4V and 2.6V; otherwise, the first period control signal HOSC is in a logic high level.

Similarly, the second period control signal LOSC is in a logic low level when the power supply voltage VDD is lower than 2.4V; otherwise, the second period control signal LOSC is in a logic high level.

Figure 4:
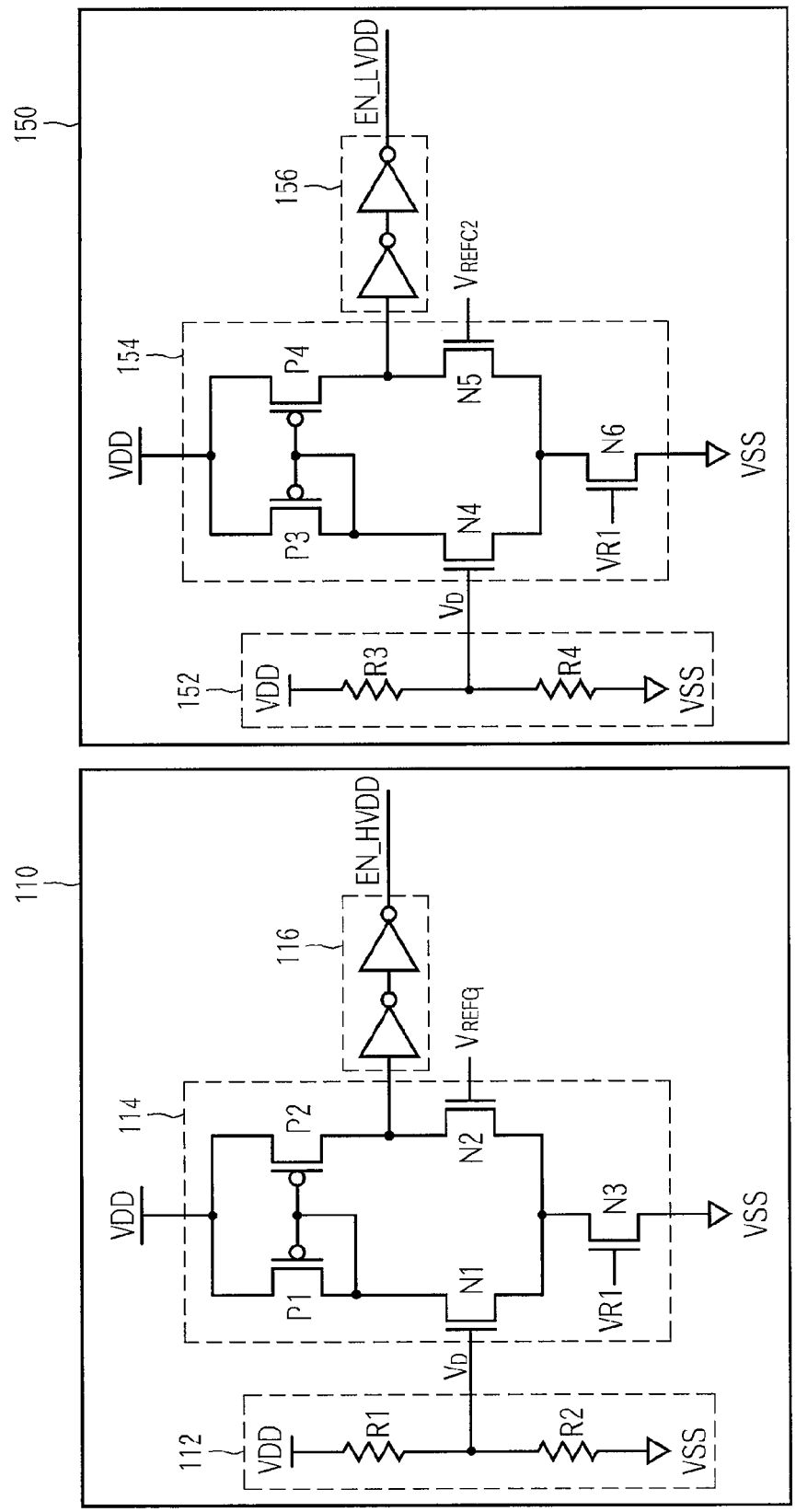
FIG. 4 is a schematic circuit diagram showing the first and the second power supply voltage detectors shown in FIG. 3.

FIG. 4 is a schematic circuit diagram showing the first and the second power supply voltage detectors 110 and 150 shown in FIG. 3. Since structures of the first and the second power supply voltage detectors 110 and 150 are the same, detailed descriptions of the second power supply voltage detector 150 are omitted.

As shown, the first power supply voltage detector 110 includes a voltage divider 112, a comparing unit 114 and a buffering unit 116.

The voltage divider 112 divides the power supply voltage VDD to thereby generate a divided voltage $V_D$. The voltage divider 112 includes a first resistor R1 and a second resistor R2 connected in series between the power supply voltage VDD and a ground voltage VSS in order to output the divided voltage $V_D$ at a node between the first and the second resistors R1 and R2. A voltage level of the divided voltage $V_D$ can be changed by adjusting each resistance of the first and the second resistors R1 and R2.

The comparing unit 114 compares a voltage level of the divided voltage $V_D$ with that of a reference voltage $V_{REFC1}$ to thereby generate a comparison signal according to the comparison result.

In detail, the comparing unit 114 is a differential amplifier including a first and a second p-type metal oxide semiconductor (PMOS) transistors P1 and P2 and a first to a third n-type metal oxide semiconductor (NMOS) transistors N1 to N3.

The first and the second PMOS transistors P1 and P2 constitute a current mirror. A gate of the first NMOS transistor N1 receives the divided voltage $V_D$. A gate of the second NMOS transistor N2 receives the reference voltage $V_{REFC1}$. The third NMOS transistor N3 is driven by a bias voltage VR1 forming a current sink for sinking a current, which is flown through the current mirror, to the ground voltage VSS. One terminal and the other terminal of the first PMOS transistor P1 are respectively coupled to the power supply voltage VDD and the first NMOS transistor N1, where the other terminal is coupled to a gate of the first PMOS transistor P1. Similarly, one terminal and the other terminal of the second PMOS transistor P22 are respectively coupled to the power supply voltage VDD and the second NMOS transistor N2, where a gate of the second PMOS transistor P2 is coupled to the gate of the first PMOS transistor P1. The first NMOS transistor N1 is connected between the first PMOS transistor P1 and the third NMOS transistor N3; likewise, the second NMOS transistor N2 is connected between the second PMOS transistor P2 and the third NMOS transistor N3. Herein, a commonly coupled node between the second PMOS transistor P2 and the second NMOS transistor N2 is an output node for outputting the comparison signal.

The buffering unit 116 buffers the comparison signal to thereby generate the first enable signal EN_HVDD.

The second power supply voltage detector 150 generates the second enable signal EN_LVDD by using the same structure and operation of the first power supply voltage detector 110. However, the second power supply voltage detector 150 receives another reference voltage, i.e., $V_{REFC2}$.

Figure 5:
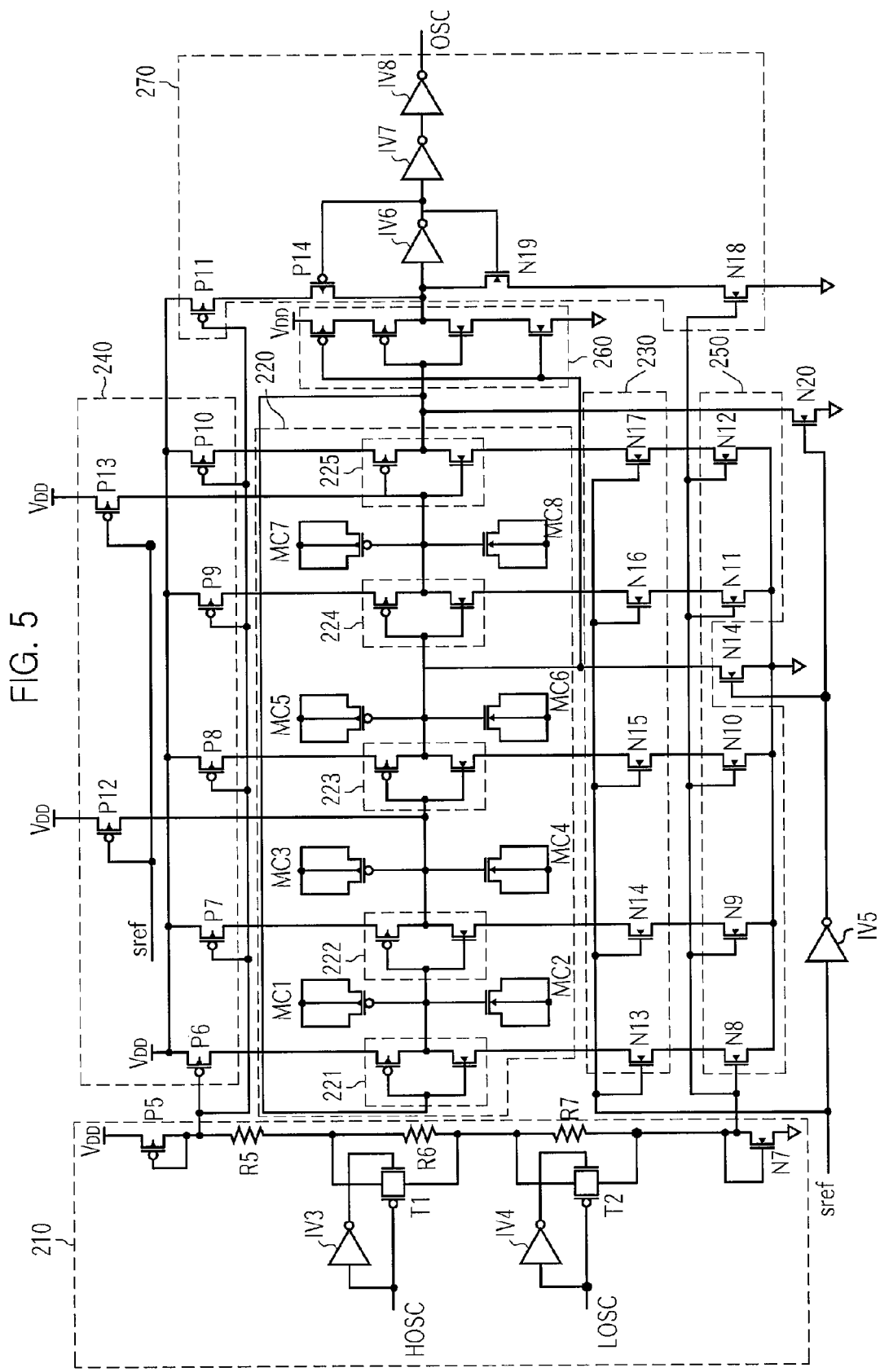
FIG. 5 is a schematic circuit diagram showing the oscillator shown in FIG. 2.

FIG. 5 is a schematic circuit diagram showing the oscillator 200 shown in FIG. 2.

As shown, the oscillator 200 includes a period control unit 210, a ring oscillator 220, a ring oscillator enabling unit 230, a ring oscillator pull-up driver 240, a ring oscillator pull-down driver 250, a ring oscillator initializing unit 260 and a buffering unit 270.

The period control unit 210 adjusts a resistance between the power supply voltage VDD and the ground voltage VSS according to the first and the second period control signals HOSC and LOSC in order to control the oscillation signal OSC to have a constant period.

In detail, the period control unit 210 includes a third and a fourth inverters IV3 and IV4, a first and a second transfer gate T1 and T2, a PMOS type diode P5, a NMOS type diode N7 and a third to a fifth resistors R5 to R7.

The PMOS type diode P5, the third to the fifth resistors R5 to R7 and the NMOS type diode N7 are connected in series between the power supply voltage VDD and the ground voltage VSS. Each terminal of the fourth resistor R6 is coupled to the first transfer gate T1 and each terminal of the fifth resistor R7 is coupled to the second transfer gate T2.

The third inverter IV3 inverts the first period control signal HOSC and inputs the inverted signal to one terminal of the first transfer gate T1. Similarly, the fourth inverter IV4 inverts the second period control signal LOSC and inputs the inverted signal to one terminal of the second transfer gate T2.

The first transfer gate T1 is turned on/off by the first period control signal HOSC and an output of the third inverter IV3, i.e., an inverted signal of the first period control signal HOSC, in order to selectively short-circuit each terminal of the fourth resistor R6. Similarly, the second transfer gate T2 is turned on/off by the second period control signal LOSC and an output of the fourth inverter IV4, i.e., an inverted signal of the second period control signal LOSC, in order to selectively short-circuit each terminal of the fifth resistor R7.

Meanwhile, the ring oscillator 220 includes odd numbers of complementary metal oxide semiconductor (CMOS) inverters, i.e., 221 to 225, connected in series and generates a ring oscillation signal having a predetermined period when the self refresh signal sref is activated. Herein, the period of the ring oscillation signal is determined by a resistance of period control resistors, i.e., the third to the fifth resistors R5 to R7. That is, an amount of current inputted to the CMOS inverters 221 to 225 through the ring oscillator pull-up driver 240 is adjusted by the resistance of the period control resistors so that the period of the ring oscillation signal is determined.

The ring oscillator enabling unit 230 is coupled to each source of NMOS transistors included in the CMOS inverters 221 to 225 in order to enable the ring oscillator 220 when the self refresh signal sref is activated. The ring oscillator enabling unit 230 includes a plurality of NMOS transistors, i.e., N13 to N17, connected between each NMOS transistors included in the CMOS inverters 221 to 225 and the ring oscillator pull-down driver 250. Herein, each of the NMOS transistors receives the self refresh signal sref.

The ring oscillator pull-up driver 240 is coupled to each source of PMOS transistors included in the CMOS inverters 221 to 225 in order to supply the power supply voltage VDD to the ring oscillator 220. The ring oscillator pull-up driver 240 includes a plurality of PMOS transistors, i.e., P6 to P10, connected between each PMOS transistors included in the CMOS inverters 221 to 225 and the power supply voltage VDD. Herein, each gate of the PMOS transistors P6 to P10 is coupled to an output of the PMOS type diode P5.

The ring oscillator pull-down driver 250 is connected between the ring oscillator enabling unit 230 and the ground voltage VSS and supplies the ground voltage VSS to the CMOS inverters 221 to 225. The ring oscillator pull-down driver 250 includes a plurality of NMOS transistors, i.e., N8 to N12, connected between the NMOS transistors N13 to N17 and the ground voltage VSS. Herein, each gate of the NMOS transistors N8 to N12 is coupled to an input of the NMOS type diode N7.

The ring oscillator initializing unit 260 is coupled to an output terminal of the ring oscillator 220 in order to initialize an output voltage of the ring oscillator 220 as a predetermined voltage according to the self refresh signal sref.

The buffering unit 270 is connected to an output terminal of the ring initializing unit 260 to thereby buffer an output of the ring oscillator 220 and output the buffered signal.

Regarding the oscillator 200, a distinguishing feature of the present invention is the period control unit 210. Since functions of other units 220 to 270 are similar to those of corresponding units of a conventional ring oscillator, detailed descriptions of the units 220 to 270 are omitted.

Referring to FIGS. 2 to 5, an operation of the self refresh period signal generator is described below.

At an initial state, when the power up signal pwrup is activated, the first period signal HOSC is outputted as a logic low level and the second period signal LOSC is outputted as a logic high level by the first and the second initializing units 130 and 170 respectively. Accordingly, the first transfer gate T1 is turned on so that both terminals of the fourth resistor R6 are short-circuited, and the second transfer gate T2 is turned off. Therefore, a total resistance of the period control unit 210 is R5+R7. This case is for satisfying a condition of VDD=2.5 according to a specification of a DRAM. Herein, a resistance of the third and the fifth resistors R5 and R7 is predetermined so that the ring oscillator 220 can generate a periodic signal having a predetermined constant period, e.g., 1 μs, according to the resistance of R5 and R7 when the power supply voltage VDD is 2.5V.

Meanwhile, when a voltage level of the power supply voltage VDD is changed during a self refresh operation, logic states of the first and the second period control signals HOSC and LOSC are changed.

For instance, when the power supply voltage VDD is higher than 2.6V, the first and the second enable signals EN_HVDD and EN_LVDD generated by the first and the second power supply voltage detectors 110 and 150 respectively are in a logic high level. Thereafter, when the MRS signal is inputted, the first and the second period control signals HOSC and LOSC are inputted to the period control unit 210 as a logic high level.

Therefore, both of the first and the second transfer gates T1 and T2 are turned off so that the total resistance of the period control unit 210 becomes R5+R6+R7. Herein, a resistance of the fourth resistor R6 is predetermined for satisfying a condition of VDD=2.5V±0.2V according to the DRAM specification so that the ring oscillator 220 can generate a periodic signal having the predetermined constant period (1 μs) according to the resistance of R5+R6+R7 when the power supply voltage VDD is, e.g., 2.7V.

Meanwhile, when the power supply voltage VDD is lower than 2.4V, both of the first and the second period control signals HOSC and LOSC are in a logic low level as shown in FIG. 3. Accordingly, both of the first and the second transfer gates T1 and T2 are turned on so that the total resistance of the period control unit 210 becomes R5. Herein, the ring oscillator 220 can generate a periodic signal having the predetermined constant period (1 μs) according to the resistance of R5 when the power supply voltage VDD is, e.g., 2.3V.

As a result, by controlling the resistance of the period control unit 210 according to the first and the second period control signals HOSC and LOSC when the power supply voltage VDD is changed, the ring oscillator 220 can constantly maintain a period of the oscillation signal OSC even though the power supply voltage VDD ranges within the DRAM specification.

Figure 6:
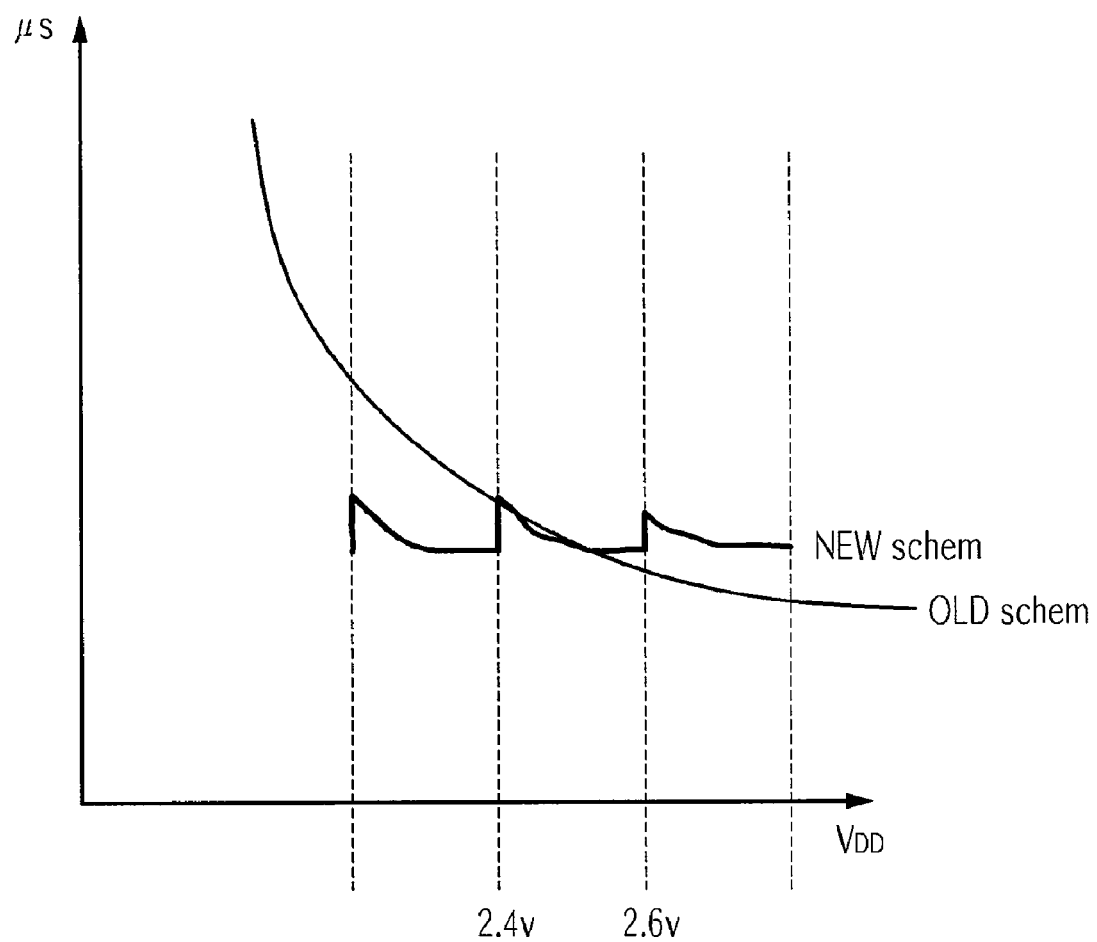
FIG. 6 is a wave diagram showing variations of a period of a self refresh operation according to the prior art and the present invention.

FIG. 6 is a wave diagram showing variations of a period of a self refresh operation according to the prior art and the present invention.

As shown, the period of the self refresh operation according to the present invention is hardly changed in comparison with the prior art.

Herein, although the preferred embodiment of the present invention divides a detection level of the power supply voltage VDD to three levels, i.e., lower than 2.4V, 2.4V to 2.6V and higher than 2.6V, for satisfying the DRAM specification, the detection levels can be more subdivided.

Therefore, even though a voltage level of a power supply voltage is changed, the self refresh period signal generator in accordance with the present invention can generate an oscillation signal having a constant period by changing a resistance of a ring oscillator according to the variation of the power supply voltage.

The present application contains subject matter related to Korean patent application No. 2004-116671, filed in the Korean Patent Office on, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A self refresh oscillation apparatus, comprising:
   a voltage detection unit for detecting a voltage level of a power supply voltage and generating first and second period control signals according to the detected voltage level; and
   an oscillation unit for receiving the first and second period control signals, and for generating an oscillation signal having a predetermined constant period in response to a self refresh command,
   wherein a logic level of the first period control signal indicates that the power supply voltage is greater than a first reference voltage, a logic level of the second period control signal indicates that the power supply voltage is greater than a second reference voltage, and the voltage level of the first reference voltage is greater than that of the second reference voltage; and
   wherein the period of the oscillation signal has the predetermined constant period regardless of the variation of the voltage level of the power supply voltage by adjusting a resistance of the oscillation unit according to the logic levels of the first and second period control signals as the voltage level of the power supply voltage changes.

2. The apparatus as recited in claim 1, wherein the oscillation unit comprises period control resistors, and
   the resistance of the period control resistors is controlled according to logic levels of the first and second period control signals and the voltage level of the power supply voltage, when the self refresh command is activated.

3. The apparatus as recited in claim 1, further comprising a divider for dividing a period of the oscillation signal by a multiple of a predetermined number.

4. The apparatus as recited in claim 1, wherein the voltage detection unit comprises:
   a first comparing unit for detecting the voltage level of the power supply voltage by comparing the power supply voltage with the first reference voltage, and generating the first period control signal according to the detected voltage level; and
   a second comparing unit for detecting the voltage level of the power supply voltage by comparing the power supply voltage with the second reference voltage, and generating the second period control signal according to the detected voltage level.

5. The apparatus as recited in claim 4, wherein the first voltage comparing unit includes:
   a first power supply voltage detector for comparing the power supply voltage with the first reference voltage and for outputting the result of comparing the power supply voltage with the first reference voltage;
   a first switching unit for selectively transferring an output of the first power supply voltage detector according to a mode control signal;
   a first initializing unit for initializing the first period control signal according to a power up signal;
   a first latch unit for latching an output of the first switching unit; and
   a first inverter for inverting an output of the first latch unit to generate the first period control signal.

6. The apparatus as recited in claim 4, wherein the second voltage comparing unit includes:
   a second power supply voltage detector for comparing the power supply voltage with the second reference voltage and for outputting the result of comparing the power supply voltage with the second reference voltage;
   a second switching unit for selectively transferring an output of the second power supply voltage detector according to a mode control signal;
   a second initializing unit for initializing the second period control signal according to a power up signal;
   a second latch unit for latching an output of the second switching unit; and
   a second inverter for inverting an output of the second latch unit to generate the second period control signal.

7. The apparatus as recited in claim 5, wherein the first power supply voltage detector includes:
   a voltage divider for dividing the power supply voltage to thereby generate a divided voltage;
   a comparing unit for comparing the divided voltage with the first reference voltage using a differential amplifier and for generating a comparison signal according to a result of comparing the divided voltage with the first reference voltage; and
   a buffering unit for buffering an output of the comparing unit and output the buffered signal.

8. The apparatus as recited in claim 6, wherein the second power supply voltage detector includes:
   a voltage divider for dividing the power supply voltage to generate a divided voltage;
   a comparing unit for comparing the divided voltage with the second reference voltage using a differential amplifier and for generating a comparison signal according to a result of comparing the divided voltage with the second reference voltage; and
   a buffering unit for buffering an output of the comparing unit and outputting the buffered signal.

9. The apparatus as recited in claim 1, wherein the oscillation unit includes:
   a period control unit for adjusting a resistance of respective period control resistors according to respective period control signals;

a ring oscillator having inverters connected in series for generating the ring oscillation signal when the self refresh signal is activated;

a ring oscillator enabling unit, enabled when the self refresh signal is activated, to enable the ring oscillator when the self refresh signal is activated;

a ring oscillator pull-up driver for supplying the power supply voltage to the ring oscillator, the power supply voltage being variable according to the resistance of the respective period control resistor;

a ring oscillator pull-down driver for supplying a ground voltage to the ring oscillator;

a ring oscillator initializing unit for initializing an output of the ring oscillator according to the self refresh signal; and a buffering unit for buffering an output of the ring oscillator and to output the buffered signal.

* * * * *